SEMICONDUCTOR APPARATUS

Filed Nov. 3, 1959

INVENTOR.
JAMES LEE JENSEN
BY Omund R. Dahle
ATTORNEY

United States Patent Office 3,002,142

Patented Sept. 26, 1961

3,002,142

SEMICONDUCTOR APPARATUS

James Lee Jensen, St. Louis Park, Minn., assignor to Minneapolis-Honeywell Regulator Company, Minneapolis, Minn., a corporation of Delaware Filed Nov. 3, 1959, Ser. No. 850,586
1 Claim. (Cl. 321—9)

This invention relates generally to transistor power inverters for converting a source of direct current potential to an alternating current potential, and relates more specifically to oscillator apparatus for approaching sine wave output from square-wave inverters.

In the field of semiconductor power inverters for converting direct current source to an alternating type source, considerable attention has been given to efficiency of conversion. A number of oscillators have been designed to operate on the switching principle wherein the semiconductor devices are alternately operated at saturation and at cutoff. With the semiconductor device operated as a switch a minimum amount of power is dissipated in the semiconductor element thereby increasing manifold the power which can be converted by a given semi-conductor unit and also providing a high degree of efficiency in conversion.

The output wave form of the switching inverter is substantially in the form of a square-wave which is generally transformer coupled to provide the desired potential to the utilizing device. While a square-wave alternating current output is entirely usable or even desirable for many applications, certain type loads such as spin motors require a sine wave output. This invention provides a novel and improved semiconductor oscillator apparatus for converting direct current power to square-wave A.C. in two similar oscillating circuits, one providing a fundamental frequency and the other providing a square-wave output three times the frequency of the first. The output wave forms of the two oscillators are selectively combined to provide a stepped wave form approaching a sine wave which can then be easily filtered by a minimum of filtering components to provide a suitable since wave output and yet retain reasonably high conversion efficiency.

It is an object of the invention therefore to provide high efficiency semiconductor apparatus for converting a direct current source to an alternating type potential by means of a pair of oscillating circuits to provide an output wave form approaching a sine wave.

It is a more specific object of the invention to provide semiconductor D.C. to A.C. inverter apparatus in which a pair of oscillating circuits of different frequencies are selectively combined to provide a stepped output wave form which approaches a sine wave.

These and other objects of the invention will become more clear upon consideration of the specification, claim and drawing of which:

Figure 1:
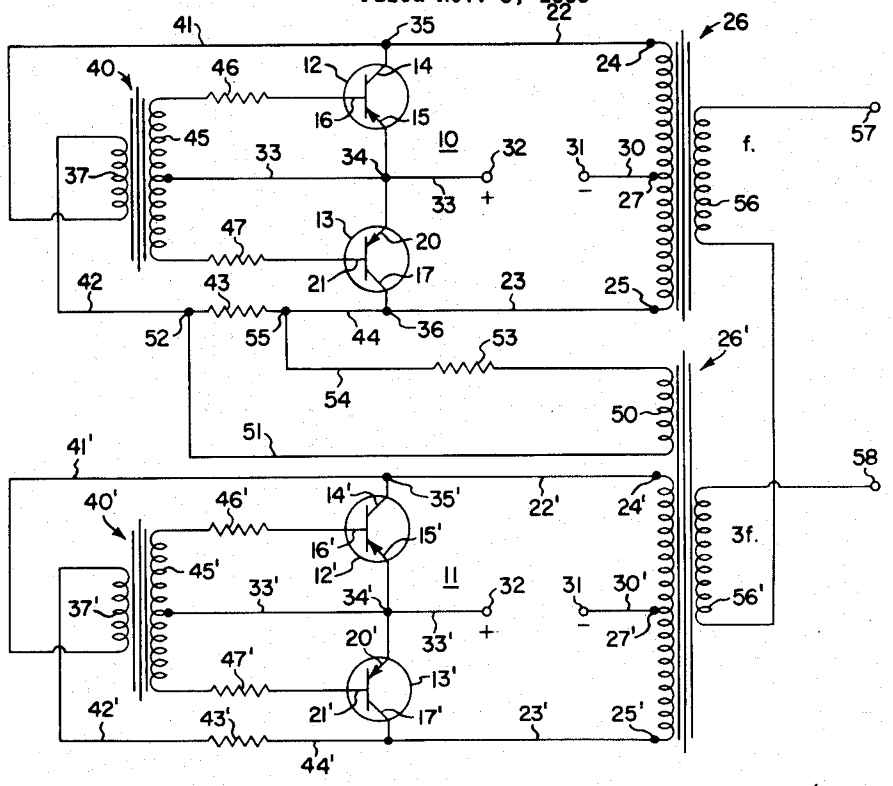
FIGURE 1 is a schematic representation of an embodiment of the invention.

Referring now to the drawing and specifically to FIGURE 1, there is disclosed a pair of oscillating circuits 10 and 11. The oscillating circuit 10 discloses a pair of semiconductor current controlling devices 12 and 13, here disclosed as junction type transistors. The transistor 12 includes a collector electrode 14, an emitter electrode 15 and a control or base electrode 16. The transistor 13 includes a collector electrode 17, an emitter electrode 20 and a control or base electrode 21. The collector electrodes 14 and 17, respectively, are connected by a pair of conductors 22 and 23 to end terminals 24 and 25 of a primary winding of an output transformer 26. The primary winding has a center tap 27 which is connected by a conductor 30 to the negative terminal 31 of a source of direct current potential, not shown. The positive terminal 32 of the potential source is connected by a conductor 33 and a junction 34 to the emitter electrodes 15 and 20 of transistors 12 and 13, respectively.

The collector electrodes 14 and 17, respectively, are also connected by junctions 35 and 36 on the conductors 22 and 23 to opposite end terminals of a primary winding 37 of a feedback transformer 40 which may, if desired, be a saturable type. The circuit can be traced from collector 14 to junction 35, through a conductor 41 to the lower terminal of primary 37, from the upper terminal of winding 37 through a conductor 42, a resistor 43, and a conductor 44 to the junction 36 on conductor 23. The feedback transformer 40 also includes a center tapped secondary winding 45 which has its upper extremity connected through a resistor 46 to the control electrode 16 of transistor 12, and its lower extremity connected through a resistor 47 to the control winding 21 of transistor 13. The center tap connection of winding 45 is directly connected by the conductor 33 to the emitters 15 and 20.

A second oscillating circuit substantially identical to that above described is the oscillating circuit 11. The same identifying numerals have been used in oscillator 11 as in oscillator 10 with the exception that the numbers are primed in the oscillator 11. The component values in oscillator 11 are different from the component values in oscillator 10 to the extent that oscillator 11 operates at three times the frequency of oscillator 10. An additional winding 50 on transformer 26′ is connected to provide a synchronizing triggering signal from the oscillator 11 to the oscillator 10. A path for the synchronizing signal may be traced from the lower extremity of winding 50 through a conductor 51 to a junction 52 on the conductor 42; and the path may be further traced from the upper terminal of the winding 50 through a resistor 53 and a conductor 54 to a junction 55 on the conductor 44. Output windings 56 and 56′ on the transformers 26 and 26′, respectively, are connected in series and provide an output at terminals 57 and 58.

Figure 2:
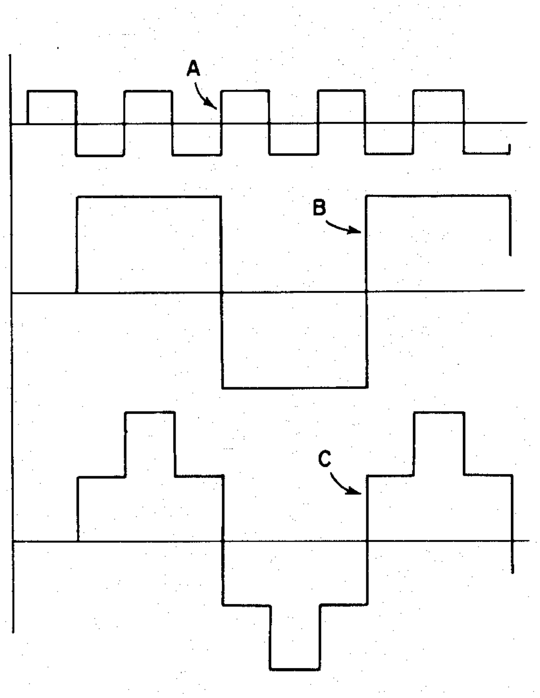
FIGURE 2 is a graphical representation of the wave forms generated by the operation of the apparatus of FIGURE 1.

In considering the operation of the embodiment of FIGURE 1, the discussion of the operation of the oscillating circuit 11 is also substantially the same for the oscillator 10 with the exception that the oscillating frequency of oscillator 11 is three times the frequency of oscillator 10. The two oscillators provide square-wave outputs at secondary windings 56 and 56′ as shown in FIGURE 2. Waveshape A represents the output waveform of the higher frequency oscillator 11 and wave B represents the output waveform of the fundamental frequency oscillator 10. The transistors 12 and 13 in oscillator 10 and the transistors 12′ and 13′ in oscillator 11 are preferably operated as switches with transistor 12 being fully conductive for one-half cycle while transistor 13 is biased to cut off, and on the succeeding half cycle with transistor 13 being fully conductive and transistor 12 being biased to cut off.

A detailed description of the operation of this type oscillator is disclosed in my Patent 2,774,878 and in my copending application Serial Number 704,713, filed December 23, 1957, entitled "Semiconductor Apparatus," and assigned to the same assignee as the present invention. Considering the operation of oscillator 11 briefly, however, with transistor 12′ conductive a feedback voltage from the output to the saturating feedback transformer 40′ is in a polarity direction to bias transistor 12′ to full conduction and simultaneously bias transistor 13′ to cutoff. After a time period determined by circuit parameters the feedback transformer 40' saturates and switching occurs in the transistor so that transistor 13' is rendered fully conductive and transistor 12' is biased to cut off. This condition of operation continues until the core of transformer 40' saturates in the opposite direction whereupon the cycle repeats itself. It is preferred that the feedback transformer 40' saturates considerably before the condition of saturation is approached in the output transformer 26', as in this manner large core losses and high voltage transients which would otherwise occur due to saturation of the output transformer are avoided. The core losses in the feedback transformer 40' are relatively insignificant when compared to the circuit as a whole.

The operation of the oscillator 10 is the same as that above described for oscillator 11. The combining of the output waveforms of the two oscillators to provide an output waveform approaching sine waveform is obtained substantially as follows. The two oscillators are maintained in synchronism by means of a synchronizing signal from the winding 50 on output transformer 26' which is applied across the resistor 43 in the feedback loop of oscillator 10. If the oscillator 11 is designed to operate at 1200 cycles per second, for example, the oscillator 10 is preferably designed to operate at a natural frequency of slightly less than 400 c.p.s. As the oscillator 10 approaches the switchover point of its own natural frequency, a synchronizing signal from the 1200 c.p.s. oscillator is effective to trigger the circuit and the two oscillators run together at 400 cycles and 1200 cycles repsectively. Under these conditions the transformer 40 of oscillator 10 need not be saturable since it is triggered by the synchronizing signal and never reaches saturation. This synchronized relationship can be seen from the curves A and B of FIGURE 2. Since the output windings 56 and 56' of the transformers 26 and 26' are connected in series, the potentials represented by curves A and B are summed at output terminals 57 and 58 to provide a stepped waveform as shown in curve C of FIGURE 2. Curve C is the waveshape resulting when the magnitude of the 1200 cycle signal is equal to one-third the magnitude of the 400 cycle signal. Assuming these relative magnitudes, the summed output has no third harmonic or multiples of thirds. The stepped waveform may be filtered by conventional filtering means to improve the waveshape.

While only a single phase inverter has been disclosed in FIGURE 1, the invention is equally applicable to a three-phase semiconductor inverter. The semiconductor switching elements have been disclosed as PNP junction transistors for explanatory purposes, however, the invention is also applicable to other square-wave inverters which may use other type transistors, silicon controlled rectifiers or the like.

The disclosure has thus far been limited to a discussion of fundamental and third harmonic potentials summed together. The disclosure has been so limited to simplify the explanation of the principles of the invention, however, the invention is not intended to be necessarily limited to the third harmonic as to a limited degree it can be applied to higher harmonics as well.

In general, while I have shown a specific embodiment of my invention, it is to be understood that this is for the purposes of illustration and that my invention is to be limited solely by the scope of the appended claim.

I claim:

Direct current to alternating current power inverter apparatus comprising in combination: first square-wave oscillator means for converting a direct current potential to a square-wave alternating type potential of a first frequency; triple frequency square-wave oscillator means for converting said direct current potential to a square-wave alternating type potential of a frequency three times said first frequency: synchronizing means connecting a portion of the output signal of said triple frequency oscillator means to the control circuit of said first frequency oscillator means to maintain a predetermined phase relation between said oscillators and means for summing the output potentials from said first and triple frequency oscillator means in a relationship to provide a resultant stepped output wave form which tends to approach sine wave.

References Cited in the file of this patent

UNITED STATES PATENTS 2,488,297 Lacy ------------------ Nov. 15, 1949